United States Patent
Willms

(10) Patent No.: US 10,998,909 B1
(45) Date of Patent: May 4, 2021

(54) SENSING DEVICE COMPRISING A PHASE LOCKED LOOP CIRCUIT

(71) Applicant: Dialog Semiconductor B.V., s-Hertogenbosch (NL)

(72) Inventor: Johannes Gerardus Willms, Oosterhout (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/568,857

(22) Filed: Sep. 12, 2019

(51) Int. Cl.
*H03L 7/099* (2006.01)
*H03F 1/56* (2006.01)
(Continued)

(52) U.S. Cl.
CPC .............. *H03L 7/0992* (2013.01); *H03F 1/26* (2013.01); *H03F 1/565* (2013.01); *H03F 3/24* (2013.01);
(Continued)

(58) Field of Classification Search
CPC ... H03F 1/00; H03F 1/26; H03F 1/565; H03F 3/24; H03L 7/06; H03L 7/10; H03L 7/23; H03L 7/089; H03L 7/093; H03L 7/099; H03L 7/107; H03L 7/0992; H04B 1/02; H04B 1/04; H04B 1/38; H04B 1/40; H04B 10/00; H04L 27/12; H04L 27/20
(Continued)

(56) References Cited

U.S. PATENT DOCUMENTS

| | | | |
|---|---|---|---|
| 3,683,279 | A | 8/1972 | Weinberg et al. |
| 4,278,925 | A | 7/1981 | Minakuchi |

(Continued)

FOREIGN PATENT DOCUMENTS

| | | |
|---|---|---|
| EP | 0 414 260 | 2/1991 |
| GB | 853920 | 11/1960 |
| GB | 1396135 | 6/1975 |

OTHER PUBLICATIONS

European Search Report, Application No. EP 90 11 6261, Applicant: Anritsu Corporation, Publication date: Aug. 26, 1992, 6 pages.
(Continued)

*Primary Examiner* — Shawkat M Ali
(74) *Attorney, Agent, or Firm* — Saile Ackerman LLC; Stephen B. Ackerman

(57) ABSTRACT

A sensing device with a phase locked loop circuit that has an oscillator to provide an oscillator output signal is presented. The sensing device has a power amplifier to provide at an output of the power amplifier an amplified output signal based on the oscillator output signal. The amplified output signal has an interfering signal component at the oscillator frequency. The sensing device has a measurement circuit to measure offset information regarding a frequency offset between the oscillator frequency and a target frequency of the oscillator. The frequency offset is due to a frequency pulling effect at the oscillator caused by the interfering signal component of the amplified output signal. The sensing device has a control circuit to use the offset information for trimming the phase locked loop circuit and/or the power amplifier, and/or for determining information regarding an environmental situation at the output of the power amplifier.

11 Claims, 4 Drawing Sheets

(51) Int. Cl.
*H03L 7/093* (2006.01)
*H03F 1/26* (2006.01)
*H03F 3/24* (2006.01)

(52) U.S. Cl.
CPC ........ *H03L 7/093* (2013.01); *H03F 2200/387* (2013.01); *H03L 2207/50* (2013.01)

(58) Field of Classification Search
USPC ............ 331/2, 11, 16, 17, 25; 341/118, 120, 341/144, 145; 375/215, 219, 295, 296, 375/327, 376; 455/76, 91, 103, 126, 127, 455/343
See application file for complete search history.

(56) References Cited

U.S. PATENT DOCUMENTS

| | | | |
|---|---|---|---|
| 4,603,306 | A | 7/1986 | Kleinberg |
| 5,254,955 | A | 10/1993 | Saeki et al. |
| 5,438,703 | A | 8/1995 | Ng et al. |
| 7,646,268 | B1 | 1/2010 | Tsironis |
| 9,257,996 | B2 | 2/2016 | Scuderi et al. |
| 2001/0035775 | A1 | 11/2001 | Andrews |
| 2007/0188244 | A1* | 8/2007 | Waheed ............ H03L 7/099 331/16 |
| 2010/0225407 | A1* | 9/2010 | Goyal ............... H03B 5/1243 331/117 FE |
| 2016/0127160 | A1* | 5/2016 | Muhammad ....... H04L 27/0014 375/260 |
| 2018/0367152 | A1* | 12/2018 | Shibata ............. H03L 7/0992 |
| 2019/0317189 | A1* | 10/2019 | Wang ................. H03F 1/32 |

OTHER PUBLICATIONS

"A Study of Injection Locking and Pulling in Oscillators," by Behzad Razavi, IEEE Journal of Solid-State Circuits, vol. 39, No. 9, Sep. 2004, pp. 415-1424.

"All Digital Phase-Locked Loop (ADPLL): A Survey," by Kusum Lata et al., International Journal of Future Computer and Communication, vol. 2, No. 6, Dec. 2013, pp. 551-555.

\* cited by examiner

SENSING DEVICE COMPRISING A PHASE LOCKED LOOP CIRCUIT

TECHNICAL FIELD

The present document relates to a sensing device which makes use of a phase locked loop circuit.

BACKGROUND

Wireless sensing devices typically comprise a sensor which is configured to capture sensor data, as well as a transmitter or transmitting device, e.g. a Bluetooth Low Energy (BLE) or a Digital Enhanced Cordless Telecommunications (DECT) transmitter, for transmitting the sensor data over a wireless communication interface.

SUMMARY

The present document is directed at reducing the cost and footprint of such sensing devices. According to an aspect, a sensing device comprising a phase locked loop circuit that comprises an oscillator which is configured to provide an oscillator output signal at an oscillator frequency is described. The sensing device comprises a power amplifier configured to provide at an output of the power amplifier an amplified output signal based on the oscillator output signal, wherein the amplified output signal comprises an interfering signal component at the oscillator frequency. In addition, the sensing device comprises a measurement circuit configured to measure offset information regarding a frequency offset between the oscillator frequency and a target frequency of the oscillator, wherein the frequency offset is due to a frequency pulling effect at the oscillator caused by the interfering signal component of the amplified output signal of the power amplifier. In addition, the sensing device comprises a control circuit configured to use the offset information for trimming the phase locked loop circuit and/or the power amplifier, and/or for determining information regarding an environmental situation at the output of the power amplifier.

Hence, the sensing device may be configured to make use of a transmitting device, e.g. a Bluetooth Low Energy (BLE) transmitter, (wherein the transmitting device comprises the power amplifier) for sensing purposes. By doing this, the cost and footprint of a wireless sensing device may be reduced.

According to another aspect, a method for sensing information using a phase locked loop circuit is described. The method comprises generating an oscillator output signal at an oscillator frequency using an oscillator of a phase locked loop circuit. Furthermore, the method comprises providing at an output of a power amplifier an amplified output signal, based on the oscillator output signal, wherein the amplified output signal comprises an interfering signal component at the oscillator frequency. In addition, the method comprises measuring offset information regarding a frequency offset between the oscillator frequency and a target frequency of the oscillator, wherein the frequency offset is due to a frequency pulling effect at the oscillator caused by the interfering signal component of the amplified output signal. The method further comprises using the offset information for trimming the phase locked loop circuit and/or the power amplifier, and/or for determining information regarding an environmental situation at the output of the power amplifier.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner (such as electromagnetic coupling).

BRIEF DESCRIPTION OF THE FIGURES

The invention is explained below in an exemplary manner with reference to the accompanying drawings, wherein.

DESCRIPTION

As indicated above, the present document is directed at reducing the cost and footprint of a wireless sensing device. A wireless sensing device typically comprises a sensor which is configured to capture a sensor signal. The sensor signal may be transmitted using a transmitter of the wireless sensing device (e.g. using a BLE device).

The transmitter typically comprises a power amplifier (PA), which is used to amplify the signal that is to be transmitted (e.g. towards a mobile phone or smartphone). The output of the PA is typically coupled to an antenna, which radiates out the signal provided by the PA. The transmitter or transceiver may make use of an All Digital Phase Locked Loop (ADPLL) for synthesizing the transmit or receive frequency.

Within such an ADPLL a Voltage Controlled Oscillator (VCO) or Digitally Controlled Oscillator (DCO) typically runs at a multiple of the transmit or receive frequency. The frequency at which the VCO/DCO runs is usually chosen not to be equal to the transmit/receive frequency, in order to reduce the so called 'frequency pulling' effect, which may result in an undesirable offset of the VCO/DCO frequency (compared to the target frequency of the VCO/DCO). An approach for reducing frequency pulling is to operate the VCO/DCO at a multiple of the frequency at which the signal is transmitted or received. In particular, the VCO/DCO may run at the double of the transmit/receive frequency.

Figure 1:
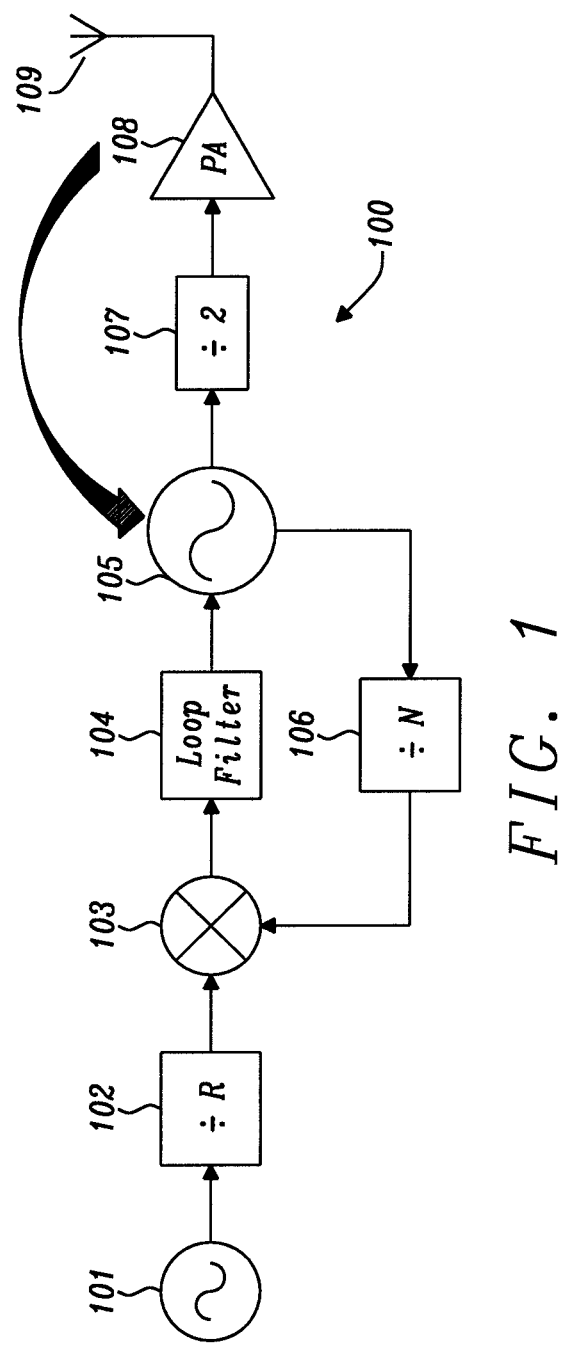
FIG. 1 illustrates an example phase locked loop (PLL) transmit circuit (which may be used for transmitting data)

FIG. 1 provides a simplified overview of a Phase Locked Loop (PLL) circuit 100, notably a PLL transmit circuit, which is configured for transmit operations. The output signal of the VCO/DCO 105 runs at the $F_{VCO/DCO}$ frequency (referred to herein as the oscillator frequency), which (in the example of FIG. 1) is twice the required transmit frequency $F_{RF}$. For this reason, the VCO/DCO 105 is followed by a frequency divider 107 which outputs the transmit signal at the required transmit frequency $F_{RF}$. The PA 108 amplifies the transmit signal to a signal that has sufficient energy to be radiated out by the antenna 109.

For supply power reduction purposes the PA 108 is typically implemented as a switching-mode power amplifier, which allows for relatively high efficiency (for a given output power level). The drawback of using a switching-mode PA 108 is that the PA 108 generates relatively strong higher order harmonics, including a $2^{nd}$ order harmonic which exhibits the same frequency as the VCO/DCO frequency.

The fact that the $2^{nd}$ harmonic frequency is equal to the VCO/DCO frequency gives rise to the so-called 'frequency pulling' effect. Although the frequencies are the same, there is typically a phase difference between the $2^{nd}$ harmonic signal generated by the PA 108 and the VCO/DCO signal. In view of the fact that there is a feedback path from the PA output to the VCO/DCO (indicated by the arrow shown in FIG. 1), this phase difference causes an offset of the VCO/DCO frequency, which is typically undesirable for a transceiver.

It should be note that in FIG. 1, the $2^{nd}$ harmonic is only used as an example. In general, the frequency pulling effect may occur at the frequency of the $n^{th}$ harmonic when the VCO/DCO 105 runs at n-times the transmit/receive frequency.

The 'frequency pulling' feedback path on the chip on which the PLL transmit circuit 100 is implemented (wherein the feedback path is indicated with the arrow in FIG. 1) can be formed in different ways. The path can be formed through the ground connection, the supply connection, the chip substrate and/or through electromagnetic coupling between the VCO/DCO inductor (not explicitly shown) and the bonding wires at the output of the PA 108, wherein the bonding wires provide the connection to the package pins. The 'frequency pulling' feedback path may be formed by a combination of the above-mentioned possible paths.

While the frequency pulling effect is typically undesirable for transceiver applications, the frequency pulling effect may be beneficial for sensing applications. In the following different examples for using the frequency pulling effect for sensing applications are described.

In order to reduce the level of unwanted harmonics (e.g. to ensure that a transceiver meets regulatory specifications (such as FCC, ETSI)), one or more circuits may be provided on the chip of the PLL transmit circuit 100, wherein the one or more circuits are used for reducing the level of one or more of the harmonics at the PA output. Optionally, harmonic levels may be further reduced by adding off-chip components on the board of the overall application.

The on-chip circuitry that is used for reducing the harmonic levels is typically trimmed in order to compensate for process spread. This trimming may be done during the production test and a trimmed value may be stored in an OTP (one-time programmable memory). The trimming measurement may be performed using a so-called Golden Module (GM), which is attached to the production load-board. Typically, each measurement site on the load-board has its own GM. Hence, the number of parallel measurement sites is limited by the area required by the GM. Therefore, a size reduction of the GM allows increasing the number of parallel measurement sites on the load-board, thereby increasing the throughput of the production test.

The GM typically comprises a notch filter for filtering out the relatively high power level of the fundamental frequency of the output signal provided by the PA 108. At the output of the notch filter, a power detector or a complete receiver may be used for measuring the level of the $2^{nd}$ harmonic. By measuring the level of the $2^{nd}$ harmonic, the test program is, in corporation with the GM, enabled to trim the device under test (DUT) such that the $2^{nd}$ harmonic level is reduced (e.g. is minimized).

The disadvantage of this test approach is the need for a highly selective notch filter that needs to be precisely trimmed to the transmit frequency band (e.g. in case of DECT (1.9 GHz) or in case of BLE (2.4 GHz)). Furthermore, a power detector or a complete receiver with a relatively high dynamic range needs to be provided on the GM. In addition, the measurement is relatively time consuming, as the power detector typically exhibits a relatively long settling time.

The frequency pulling effect may be used for trimming the level of the $2^{nd}$ harmonic. The PA output may be terminated during the production test with a fixed impedance. When performing the on-chip trimming procedure for trimming the level of the $2^{nd}$ harmonic, the level of the $2^{nd}$ harmonic at the PA output varies as the trimming parameter is changed. Through the feedback path towards the VCO/DCO 105, the VCO/DCO 105 experiences a frequency offset, wherein the amount or the extent of frequency offset of the VCO/DCO frequency is a measure for the level of the $2^{nd}$ harmonic level at the PA output. Hence, the trimming parameter may be adapted in order to reduce, notably in order to minimize, the frequency offset. In other words, trimming may be performed by reducing, notably by minimizing, the frequency offset.

The characteristics of the feedback path may be modified by modifying the termination impedance of the PA 108. Optionally, the feedback path that is used for trimming the $2^{nd}$ harmonic, may be adapted, in particular, the sensitivity of the feedback path may be increased, by changing the termination impedance of the PA 108. The trimming procedure may be performed for several different termination impedances and the best results from the different measurements may be used as a result of the trimming procedure. Hence, the 'sensitivity' of the measurement of the frequency offset for trimming a PLL transmit circuit 100 can be improved.

By making use of the 'frequency pulling' feedback path, the trimming may be performed by sensing the modulation input of the VCO/DCO 105 while trimming the register that controls the on-chip circuitry for reducing the level of the $2^{nd}$ harmonic. As a result of this, the highly selective notch filter can be removed from the measurement setup. Furthermore, the power detector may be removed or a simplified receiver may be used on the GM. In addition, the test time for trimming may be reduced.

Figure 2:
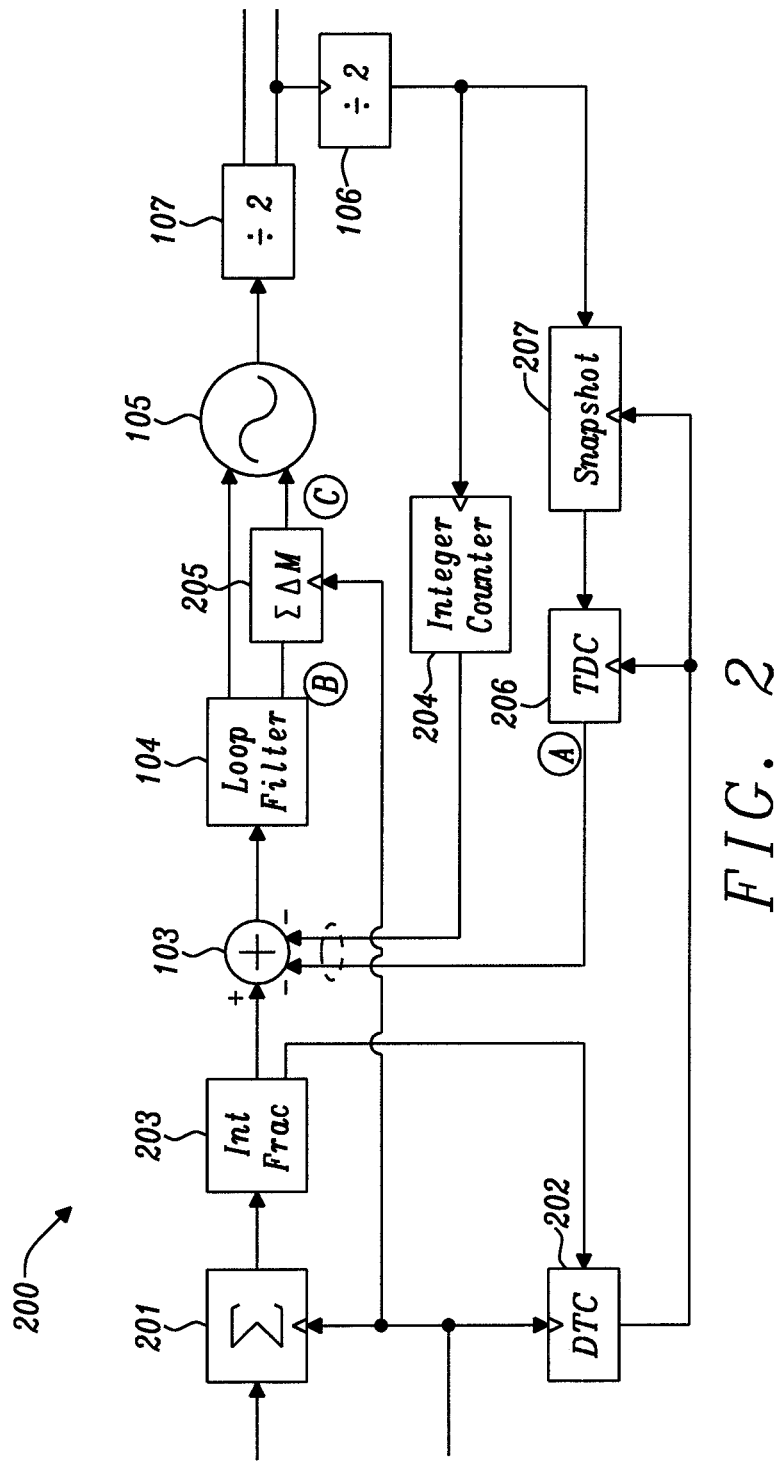
FIG. 2 shows an example all digital phase locked loop (ADPLL) circuit.

FIG. 2 shows an example ADPLL circuit 200. In the described method the frequency offset inside the ADPLL circuit 200 may be detected at the modulation input (point C) of the DCO 105. It should be noted, however, that other points (e.g. points A and/or B) within the ADPLL circuit 200 may be used for detecting the frequency offset.

As outlined above, a PLL transmit circuit 100 (comprising an additional power amplifier 108) and/or a PLL circuit 200 may be trimmed using a tunable notch filter, in order to reduce the level of the $2^{nd}$ order harmonic. Alternatively, trimming may be performed using the frequency pulling method. It can be shown that the same trimming parameter can be obtained using both methods.

As indicated above, the impedance at the output of the PA 108 may change. A first impedance value may be indicative of an antenna 109 which is working correctly and a second impedance value may be indicative of an antenna 109 which exhibits a defect. The change of the impedance value typically leads to an increased impact of the frequency pulling effect, notably in case of a relatively strong $2^{nd}$ harmonic. Hence, by monitoring the extent of the strength of the frequency offset caused by the frequency pulling effect, an indication of the impedance at the output of the PA 109 may be determined, e.g. in order to detect a faulty antenna 109.

A further option for using the above mentioned frequency pulling effect, is to monitor the heart-rate (e.g. the heart-rate of a human being) by placing an antenna 109 on the wrist of a person or on another location on the body (e.g. the chest or close to any other (main) artery). The dynamic change in the electromagnetic field around the antenna 109 that is caused by the pulsating of the arteries causes a change in the electrical antenna impedance. This change in antenna impedance results (through the feedback path) in a frequency offset in the VCO/DCO frequency. This offset can be a measured, and the heart-rate of the person may be deduced based on the measured frequency offset. Hence, a cost-efficient method for determining the heart-rate of a person is provided (as no LED and photo detector is needed, as is typically required for a conventional photoplethysmography method). Furthermore, the method is independent on skin color and less dependent on the distance between the skin and the antenna 109.

As indicated above, the method may be used for sensing whether the antenna 109 is blocked or not. Changing the static environment of the antenna 109, e.g. using a hand or a metal cover, will cause a static change in the electrical input impedance of the antenna 109. Through the frequency pulling feedback path the VCO/DCO 105 will experience a static frequency offset. The detected frequency offset may be used to decide on whether it makes sense to transmit or receive a signal or whether to wait with regards to transmitting or receiving data (e.g. because the antenna 109 is blocked or broken).

In order to sense an impedance change, the $2^{nd}$ harmonic level at the output of the DCO 105 should be relatively high. Hence, a first trimming parameter (leading to relatively high level $2^{nd}$ harmonics) may be used when operating the circuit 100, 200 as a sensor. On the other hand, a second trimming parameter (leading to relatively low level $2^{nd}$ harmonics) may be used, when operating the circuit 100, 200 as a transceiver. As a result of this, a particularly efficient wireless sensing circuit may be provided.

The PLL circuit 100 of FIG. 1 comprises further components for setting the oscillator frequency of the oscillator 105 to a target frequency. The target frequency may be given by a reference oscillator 101, which is configured to generate a reference signal at a reference frequency, wherein the reference frequency may be modified using a frequency divider 102. Furthermore, a feedback signal may be generated from the oscillator signal (provided by the oscillator 105) using a divider 106. The feedback signal may be compared with the reference signal using a phase and/or frequency comparator 103, and the output of the phase and/or frequency comparator 103 may be filtered (notably integrated) using the loop filter 104, wherein the output of the loop filter 104 is used to control the oscillator 105.

In a similar manner, the ADPLL 200 shown in FIG. 2 comprises circuitry 201, 202, 203, 204, 206, 207 for setting and for locking the oscillator frequency of the oscillator 105. Furthermore, the ADPLL circuit 200 of FIG. 2 comprises a modulator 205 which may be used for modulating the oscillator output signal which is provided by the oscillator 105, in order to transmit data within the oscillator output signal. In addition, FIG. 2 shows example points A, B or C which may be used for measuring the frequency offset caused by the frequency pulling effect.

Figure 3:
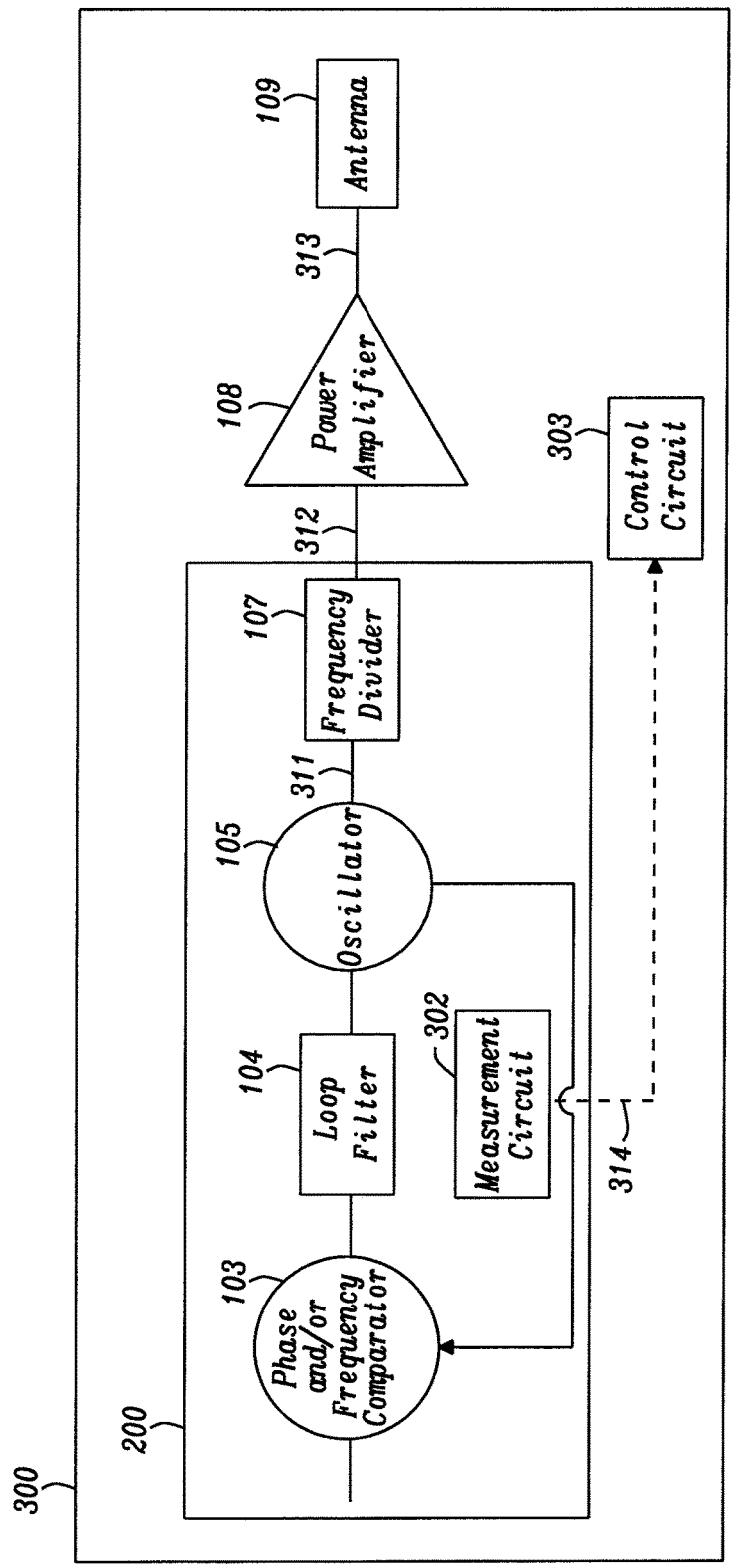
FIG. 3 shows an example sensing device comprising a PLL transmit circuit.

FIG. 3 shows an example sensing device 300 which comprises a phase locked loop circuit 200. The phase locked loop circuit 200 may comprise or may be an all digital phase locked loop. The phase locked loop circuit 200 comprises an oscillator 105, which is configured to provide an oscillator output signal 311 at an oscillator frequency. The oscillator 105 may comprise or may be a digitally controlled oscillator.

In addition, the sensing device 300 comprises a power amplifier 108 which is configured to provide at an output of the power amplifier 108 an amplified output signal 313. The amplified output signal 313 may be generated based on the oscillator output signal 311. In particular, the amplified output signal 313 may be generated such that the amplified output signal 313 comprises an interfering signal component at the oscillator frequency. The interfering signal component may cause a so-called frequency pulling effect at the oscillator 105, wherein the frequency pulling effect may be due to a so-called frequency pulling feedback path (as illustrated e.g. in FIG. 1).

In particular, the sensing device 300 may comprise a frequency divider 107 which is configured to derive a divider output signal 312 at a divider frequency from the oscillator output signal 311, wherein the divider frequency is the oscillator frequency divided by an integer factor n. In a preferred example, n=2. The divider frequency may be the fundamental frequency of the amplified output signal 313.

The power amplifier 108 may be configured to amplify the divider output signal 312 to provide the amplified output signal 313 at the divider frequency. As a result of the amplification, the interfering signal component of the amplified output signal 313 may comprise or may be an $n^{th}$ order harmonic of the divider frequency (i.e. of the fundamental frequency of the amplified output signal 313). The power amplifier 108 may comprise or may be a switched-mode power amplifier. As a result of this, power efficient power amplification may be performed. On the other hand, a switched-mode power amplifier may lead to an $n^{th}$ order harmonic having a relatively high energy level.

In addition, the sensing device 300 may comprise a measurement circuit 302 which is configured to measure offset information 314 regarding a frequency offset between the oscillator frequency and the target frequency of the oscillator 105. The target frequency may be set by the phase locked loop circuit 200. The frequency offset may be due to a frequency pulling effect at the oscillator 105, which is caused by the interfering signal component of the amplified output signal 313. The extent of the frequency offset typically increases with increasing energy level of the interfering signal component. The energy level may be indicated in a relative manner, relative to the energy level of the fundamental signal component of the amplified output signal 313 at the fundamental frequency.

The offset information may be indicative of the difference between the target frequency and the oscillator frequency. This difference may be zero, in case the energy level of the interfering signal component is zero and/or in case no frequency pulling effect occurs. On the other hand, the difference may increase with increasing energy level of the interfering signal component and/or with increasing importance of the frequency pulling effect.

The sensing device may further comprise a control circuit 303 which is configured to use the offset information 314. The offset information 314 may be used for trimming the phase locked loop circuit 200 and/or the power amplifier 108. In particular, trimming circuitry (which may be considered to be part of the power amplifier 108) may be trimmed. The control circuit 303 may be configured to modify at least one trimming parameter for trimming the phase locked loop circuit 200 and/or the power amplifier 108 such that the frequency offset is decreased and/or such that the energy level of the interfering signal component is decreased (relative to the energy level of the fundamental signal component). By doing this, an efficient trimming of a phase locked loop circuit 200 and/or a power amplifier 108, notably of a transceiver comprising a phase locked loop circuit 200 and/or a power amplifier 108, may be achieved.

The impedance at the output of the power amplifier 108 may be set such that the frequency pulling effect is relatively strong, notably maximized. As a result of this, the trimming may be performed in a particularly precise manner.

Alternatively, or in addition, the offset information 314 may be used for determining information regarding an environmental situation at the output of the power amplifier 108. In particular, the control circuit 303 may be configured to determine impedance information regarding an impedance at the output of the power amplifier 108 based on the offset information 314. By doing this, sensing applications may be implemented in a particularly efficient manner.

The sensing device 300 may comprise an antenna 109 which is configured to radiate the amplified output signal 313. The control circuit 303 may be configured to determine information regarding the impedance of the antenna 109 based on the offset information 314. By doing this, it may be determined in an efficient manner whether the antenna 109 is (momentarily) blocked and/or whether the antenna 109 is faulty. Furthermore, the antenna 109, notably the impedance of the antenna 109, may be used to sense the environment of the output of the power amplifier 108 in a reliable manner. As outlined in the present document, the impedance measurement of the antenna 109 may be used e.g. for measuring the heart-rate (or other effects that have an impact on the impedance of the antenna 109).

The control circuit 303 may be configured to set the (at least one) trimming parameter of the phase locked loop circuit 200 and/or of the power amplifier 108 to a first value, wherein the first value leads to an interfering signal component having an energy level higher than a pre-defined energy threshold. As a result of this, the frequency pulling effect at the oscillator 105 may be relatively high, thereby increasing the sensing sensitivity of the sensing device 300.

Furthermore, the control circuit 303 may be configured to determine first information regarding an environmental situation at the output of the power amplifier 108 based on offset information that has been measured while the trimming parameter is set to the first value. As a result of this, the information regarding the environment (notably the impedance) at the output of the power amplifier 108 may be determined in a precise manner.

As indicated above, the sensing device 300 may be configured to transmit data. For this purpose, the sensing device 300 may comprise an antenna 109. Furthermore, the sensing device 300 may comprise a modulator 205 (e.g. a sigma delta modulator) which is configured to modulate data into the oscillator output signal 311. In particular, the oscillator output signal 311 may be frequency modulated.

The control circuit 303 may be configured to set the trimming parameter of the phase locked loop circuit 200 and/or the power amplifier 108 to a second value, wherein the second value leads to an interfering signal component having an energy level lower than the pre-defined energy threshold. By decreasing the energy level of the interfering signal component, the sensing circuit 300 may be prepared for an efficient transmission of data.

In addition, the control circuit 303 may be configured to control the modulator 205 to modulate the first information into the oscillator output signal 311, while the trimming parameter is set to the second value. Hence, the sensing circuit 300 may be configured to provide a sensing functionality and a (subsequent) transmission functionality in an efficient manner (using the same components). By doing this, a cost and footprint efficient wireless sensing device 300 may be provided.

As indicated above, the sensing device 300 may comprise a modulator 205 which is configured to modulate data into the oscillator output signal 311. For this purpose, a modulation input of the oscillator 105 may be used. The measurement circuit 302 may be configured to measure the offset information 314 at the modulation input of the oscillator 105. By doing this, the offset information 314 may be determined in a precise manner.

Figure 4:
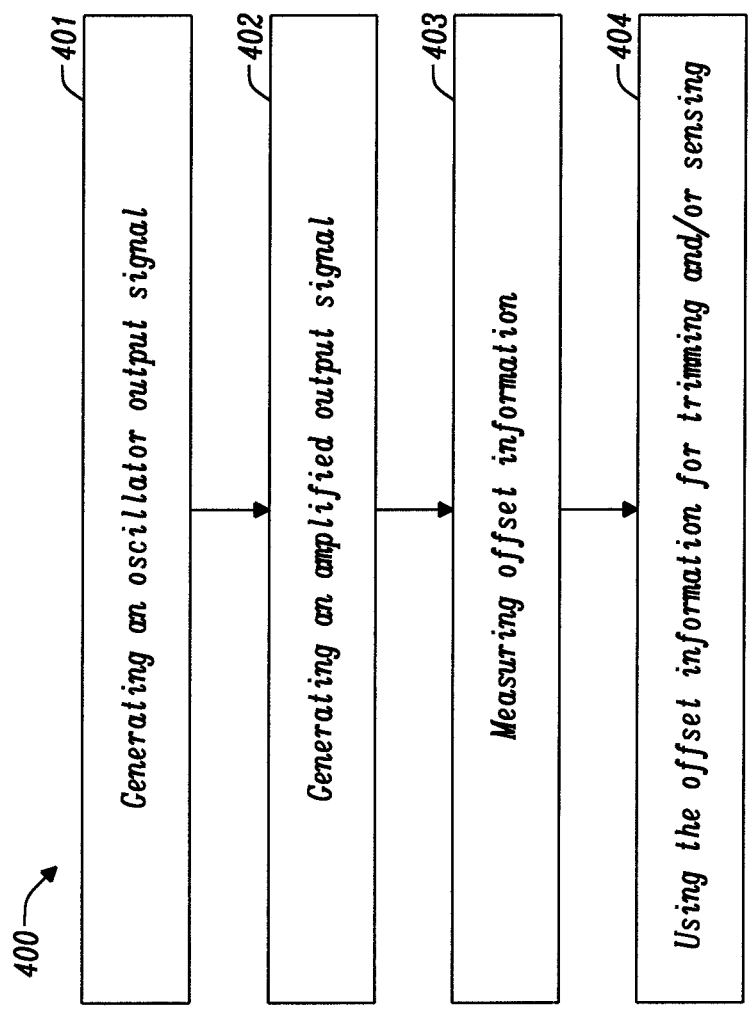
FIG. 4 shows a flow chart of an example method for sensing data using a PLL transmit circuit.

FIG. 4 shows a flow chart of an example method 400 for sensing information using a phase locked loop circuit 200. The method 400 comprises generating 401 an oscillator output signal 311 at an oscillator frequency using an oscillator 105 of a phase locked loop circuit 200. Furthermore, the method 400 comprises providing 402 at an output of a power amplifier 108 an amplified output signal 313, based on the oscillator output signal 311, wherein the amplified output signal 313 comprises an interfering signal component at the oscillator frequency. In addition, the method 400 comprises measuring 403 offset information 314 regarding a frequency offset between the oscillator frequency and a target frequency of the oscillator 105, wherein the frequency offset is due to a frequency pulling effect at the oscillator 105 caused by the interfering signal component of the amplified output signal 313. The method 400 further comprises using 404 the offset information 314 for trimming the phase locked loop circuit 200 and/or the power amplifier 108, and/or for determining information regarding an environmental situation at the output of the power amplifier 108.

In the present document, schemes have been described, which make use of the frequency pulling feedback path that is present on transceivers, for which the VCO/DCO frequency is equal to the frequency of one of the transmit harmonic frequencies. In particular, the frequency pulling feedback path may be used for sensing events or signals at the outside of the chip of the sensing device 300, which result in a static or dynamic change in the electrical input impedance of the antenna 109 of the sensing device 300.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:
1. A sensing device comprising:
   a phase locked loop circuit comprising an oscillator configured to provide an oscillator output signal at an oscillator frequency;
   a frequency divider configured to derive a divider output signal at a divider frequency from the oscillator output signal, wherein the divider frequency is the oscillator frequency divided by an integer factor n;
   a power amplifier configured to amplify the divider output signal to provide an amplified output signal at the divider frequency, wherein the amplified output signal comprises an interfering signal component at the oscillator frequency, and wherein the interfering signal component comprises an $n^{th}$ order harmonic of the divider frequency;

a measurement circuit configured to measure offset information regarding a frequency offset between the oscillator frequency and a target frequency of the oscillator, wherein the frequency offset is due to a frequency pulling effect at the oscillator caused by the interfering signal component of the amplified output signal; and a control circuit configured to utilize the offset information
- for trimming the power amplifier; and/or
- for determining information regarding an environmental situation at the output of the power amplifier.

2. The sensing device of claim 1, wherein n=2.

3. The sensing device of claim 1, wherein the control circuit is configured to determine impedance information regarding an impedance at the output of the power amplifier based on the offset information.

4. The sensing device of claim 1, wherein the control circuit is configured to modify a trimming parameter for trimming the phase locked loop circuit and/or the power amplifier such that the frequency offset is decreased and/or such that an energy level of the interfering signal component is decreased.

5. The sensing device of claim 1, wherein the control circuit is configured to
- set a trimming parameter of the phase locked loop circuit and/or the power amplifier to a first value; wherein the first value leads to an interfering signal component having an energy level higher than a pre-defined energy threshold; and
- determine first information regarding an environmental situation at the output of the power amplifier based on offset information that has been measured while the trimming parameter is set to the first value.

6. The sensing device of claim 5, wherein
the sensing device comprises a modulator configured to modulate data into the oscillator output signal; and
the control circuit is configured to
- set the trimming parameter of the phase locked loop circuit and/or the power amplifier to a second value; wherein the second value leads to an interfering signal component having an energy level lower than the pre-defined energy threshold; and
- control the modulator to modulate the first information into the oscillator output signal, while the trimming parameter is set to the second value.

7. The sensing device of claim 1, wherein
the sensing device comprises a modulator configured to modulate data into the oscillator output signal utilizing a modulation input of the oscillator; and
the measurement circuit is configured to measure the offset information at the modulation input of the oscillator.

8. The sensing device of claim 1, wherein
the sensing device comprises an antenna configured to radiate the amplified output signal; and
the control circuit is configured to determine information regarding an impedance of the antenna based on the offset information.

9. The sensing device of claim 1, wherein
the phase locked loop circuit comprises an all digital phase locked loop; and
the oscillator comprises a digitally controlled oscillator.

10. The sensing device of claim 1, wherein the power amplifier comprises a switched-mode power amplifier.

11. A method for sensing information utilizing a phase locked loop circuit, the method comprising:
generating an oscillator output signal at an oscillator frequency utilizing an oscillator of the phase locked loop circuit;
deriving a divider output signal at a divider frequency from the oscillator output signal utilizing a frequency divider, wherein the divider frequency is the oscillator frequency divided by an integer factor n;
amplifying the divider output signal utilizing a power amplifier to provide an amplified output signal at the divider frequency, wherein the amplified output a signal comprises an interfering signal component at the oscillator frequency, and wherein the interfering signal component comprises an $n^{th}$ order harmonic of the divider frequency;
measuring offset information regarding a frequency offset between the oscillator frequency and a target frequency of the oscillator, wherein the frequency offset is due to a frequency pulling effect at the oscillator caused by the interfering signal component of the amplified output signal; and
utilizing the offset information
- for trimming the power amplifier; and/or
- for determining information regarding an environmental situation at the output of the power amplifier.

\* \* \* \* \*